(12) United States Patent
Hata

(10) Patent No.: US 9,196,761 B2
(45) Date of Patent: Nov. 24, 2015

(54) SEMICONDUCTOR OPTICAL DEVICE

(71) Applicant: Mitsubishi Electric Corporation, Tokyo (JP)

(72) Inventor: Tadayoshi Hata, Nagasaki (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 162 days.

(21) Appl. No.: 14/037,444

(22) Filed: Sep. 26, 2013

(65) Prior Publication Data

US 2014/0211472 A1    Jul. 31, 2014

(30) Foreign Application Priority Data

Jan. 31, 2013  (JP) ................................. 2013-016560

(51) Int. Cl.
*H01L 31/0232* (2014.01)
*F21K 99/00* (2010.01)
*H01L 31/0203* (2014.01)

(52) U.S. Cl.
CPC ...... *H01L 31/02325* (2013.01); *H01L 31/0203* (2013.01); *H01L 2224/45144* (2013.01); *H01L 2224/48091* (2013.01)

(58) Field of Classification Search
CPC combination set(s) only.
See application file for complete search history.

(56) References Cited

U.S. PATENT DOCUMENTS

| | | | |
|---|---|---|---|
| 5,040,868 A * | 8/1991 | Waitl et al. ..................... 385/33 |
| 5,274,456 A | 12/1993 | Izumi et al. |
| 5,400,072 A | 3/1995 | Izumi et al. |
| 5,783,815 A * | 7/1998 | Ikeda .......................... 250/208.1 |
| 6,122,009 A * | 9/2000 | Ueda ............................. 348/335 |
| 6,587,491 B1 | 7/2003 | Yamamoto |
| 7,656,452 B2 * | 2/2010 | Saito et al. ..................... 348/340 |
| 8,525,206 B2 * | 9/2013 | Blumel et al. .................. 257/98 |
| 8,669,572 B2 * | 3/2014 | Leung et al. .................... 257/98 |
| 2002/0131782 A1 * | 9/2002 | Yamaguchi et al. .......... 396/429 |
| 2003/0016454 A1 * | 1/2003 | Yamaguchi et al. .......... 359/819 |
| 2003/0076862 A1 * | 4/2003 | Itoh .................................. 372/36 |
| 2003/0184885 A1 * | 10/2003 | Tansho et al. ................. 359/819 |
| 2004/0113047 A1 * | 6/2004 | Tu ............................... 250/208.1 |

(Continued)

FOREIGN PATENT DOCUMENTS

| | | |
|---|---|---|
| JP | 3-30581 A | 2/1991 |
| JP | 7-218773 A | 8/1995 |

(Continued)

OTHER PUBLICATIONS

Korean Patent Office; Office Action in Korean Patent Application No. 10-2014-0003154 (Mar. 26, 2015).

*Primary Examiner* — Ha Tran T Nguyen
*Assistant Examiner* — Jordan Klein
(74) *Attorney, Agent, or Firm* — Leydig, Voit & Mayer, Ltd.

(57) ABSTRACT

A semiconductor optical device includes a stem; a semiconductor optical element mounted on the stem; a resin cap including a cylindrical body portion, a plate portion, and an edge portion; and a lens attached integrally to the plate portion of the cap. The edge portion of the cap is bonded to the stem so that the cap covers the semiconductor optical element. The cylindrical body portion of the cap has at least one first portion and second portions which are spaced apart from each other in the circumferential direction of the cylindrical body portion and which project inwardly relative to the at least one first portion. The stem has projections, and each projection vertically underlies and engages or contacts a surface of a respective one of the second portions of the cap.

13 Claims, 13 Drawing Sheets

A-A' CROSS-SECTION

(56) References Cited

U.S. PATENT DOCUMENTS

| | | | |
|---|---|---|---|
| 2004/0165356 A1* | 8/2004 | Mun et al. | 361/715 |
| 2005/0110889 A1* | 5/2005 | Tuttle et al. | 348/340 |
| 2005/0276207 A1* | 12/2005 | Oka et al. | 369/112.23 |
| 2005/0280014 A1* | 12/2005 | Park et al. | 257/98 |
| 2006/0109366 A1* | 5/2006 | Humpston et al. | 348/340 |
| 2006/0221225 A1* | 10/2006 | Tsukamoto et al. | 348/340 |
| 2007/0267643 A1* | 11/2007 | Harada et al. | 257/98 |
| 2008/0025678 A1* | 1/2008 | Yabe | 385/94 |
| 2008/0087974 A1* | 4/2008 | Kwon et al. | 257/432 |
| 2009/0201414 A1* | 8/2009 | Kinoshita | 348/374 |
| 2009/0256229 A1* | 10/2009 | Ishikawa et al. | 257/434 |
| 2009/0262509 A1* | 10/2009 | Saji et al. | 361/809 |
| 2010/0025846 A1* | 2/2010 | Nishiyama | 257/729 |
| 2010/0110269 A1* | 5/2010 | Honda et al. | 348/340 |
| 2010/0199491 A1* | 8/2010 | Watanabe et al. | 29/832 |
| 2014/0090692 A1* | 4/2014 | Okamoto et al. | 136/246 |
| 2014/0124812 A1* | 5/2014 | Kuramoto et al. | 257/98 |

FOREIGN PATENT DOCUMENTS

| | | |
|---|---|---|
| JP | 2003-35855 A | 2/2003 |
| JP | 2007-127925 A | 5/2007 |
| JP | 2007-134644 A | 5/2007 |
| JP | 2008-135508 A | 6/2008 |
| JP | 2010-183002 A | 8/2010 |
| KR | 10-2001-0050867 A | 6/2001 |

* cited by examiner

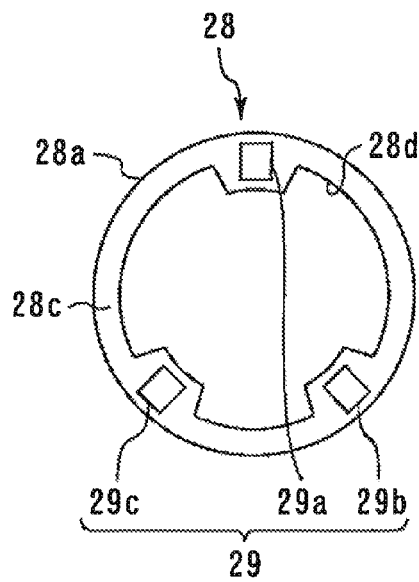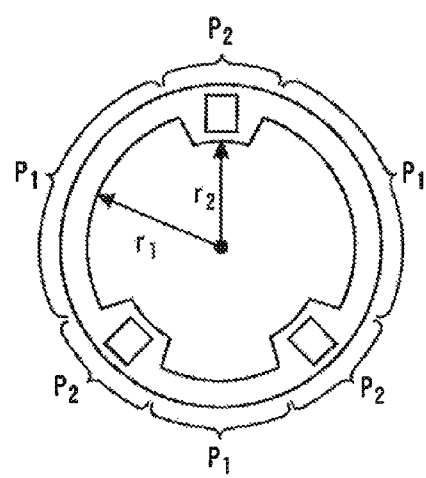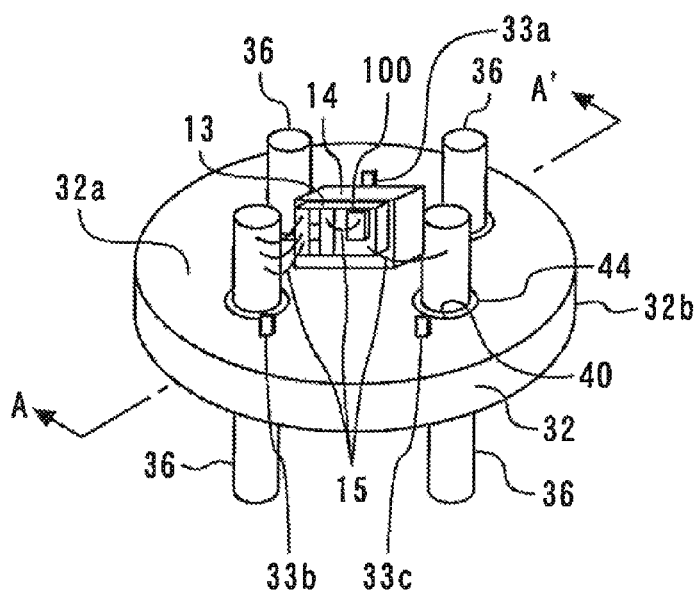

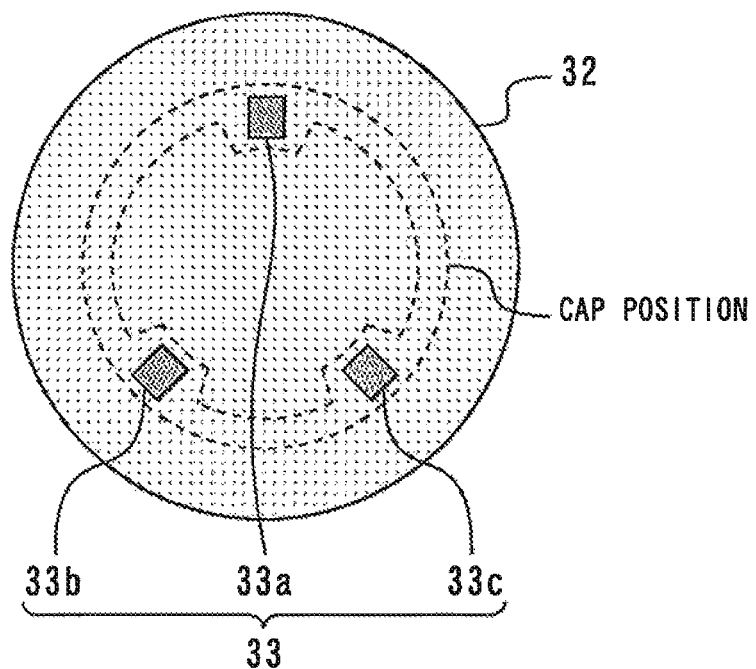
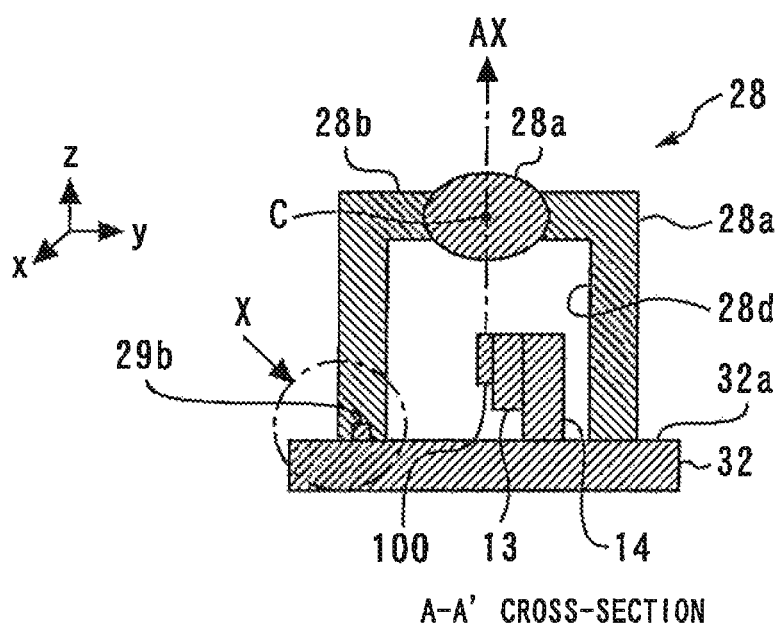
Fig. 6

X PORTION ENLARGED

B-B CROSS-SECTION

C-C CROSS-SECTION

D-D CROSS-SECTION

CORRESPONDING POSITION TO X PORTION

CORRESPONDING POSITION TO X PORTION

E-E CROSS-SECTION

SEMICONDUCTOR OPTICAL DEVICE

FIELD OF THE INVENTION

The present invention relates to a semiconductor optical device.

BACKGROUND ART

Semiconductor optical devices in which a lens is attached integrally to its mounting member by molding have been known, as disclosed, e.g., in Japanese Laid-Open Patent Publication No. H07-218773. (In the case of the semiconductor optical device disclosed in this publication, the mounting member is a pipe.) Traditionally, in the manufacture of semiconductor optical devices, the circumference of the lens is metalized, and the lens is secured to a mounting member of metal by soldering, etc. The technique disclosed in the above publication has an advantage over this conventional technique in that a reduced number of parts and a reduced number of joins are required and hence higher mass productivity can be attained since the lens is attached integrally to the mounting member by molding.

In the case of CAN packages, the lens is mounted to a cylindrical mounting member called a cap. The cap may be formed of a resin, and the lens may be attached integrally to this cap by molding to achieve the same advantages as described in connection with the technique of the above publication. However, unlike metal caps, which are traditionally used, a resin cap cannot be secured to the stem by welding. Therefore, the cap may be bonded to the stem by an adhesive.

In semiconductor optical devices configured as CAN packages, the semiconductor optical element is mounted inside the cap. The semiconductor optical element is either a semiconductor laser diode or a photodiode. The accuracy of the alignment of the lens with the optical axis of the semiconductor optical element is an important factor in determining the performance of the semiconductor optical device. In the alignment process, the lens is positioned relative to the semiconductor optical element so that the lens is spaced a predetermined distance from the semiconductor optical element in the direction of the optical axis of the semiconductor optical element (i.e., Z direction in, e.g., FIG. 1) and oriented perpendicular to the optical axis of the semiconductor optical element (i.e., oriented parallel to X-Y plane in FIG. 1). That is, the cap with the lens integrally attached thereto must be accurately aligned with and secured to the stem.

In order to accomplish this, Japanese Laid-Open Patent Publication No. H07-218773 noted above and Japanese Laid-Open Patent Publication No. 2003-035855 disclose techniques in which a mounting member (cap) with a lens integrally attached thereto and a stem are provided with steps and/or recesses, thereby making it possible to accurately align the mounting member with the stem using these steps and recesses.

Other prior art include Japanese Laid-Open Patent Publication Nos. 2010-183002 and H03-030581.

CAN packages are configured by mounting various components (including optical elements, such as a semiconductor optical element, and electrical parts) in a closely spaced relationship on a stem and then covering and sealing these components with a cap. Since the cap is mounted on the top surface of the stem, the area available on the top surface for mounting components is limited. Further, providing the cap and the stem with steps or recesses for positioning the cap on the stem (as described in connected with the above conventional techniques) requires the use of some area on the stem, thus reducing the area available on the top surface of the stem for mounting components.

SUMMARY OF THE INVENTION

The present invention has been made to solve the above problems. It is, therefore, an object of the present invention to provide a semiconductor optical device including a cap and a stem and configured such that the cap can be accurately aligned with and secured to the stem while maximizing the interior space of the cap.

According to a first aspect of the present invention, a semiconductor optical device includes: a stem, a semiconductor optical element secured to the stem, a resin cap, and a lens. The resin cap includes a cylindrical body portion having an inside surface and an outside surface which extend along an entire length of the cylindrical body portion. The resin cap further includes a plate portion disposed at one end of the cylindrical body portion and an edge portion disposed at the other end of the cylindrical body portion. The edge portion has a lower surface bonded to the stem so that the resin cap covers the semiconductor optical element. The lens is attached integrally to the plate portion of the cap. Wherein, the cylindrical body portion has at least one first portion and a plurality of second portions which are spaced apart from each other in a circumferential direction of the cylindrical body portion and which project inwardly relative to the at least one first portion, and wherein each of the second portions has a first engagement feature, and the stem has a plurality of second engagement features, each vertically underlying and engaging or contacting a respective one of the first engagement features of the second portions.

Other and further objects, features and advantages of the invention will appear more fully from the following description.

BRIEF DESCRIPTION OF THE DRAWINGS

FIGS. 3A and 3B show bottom views of the cap of the semiconductor optical device of the first embodiment.

FIG. 4 is a perspective view showing the internal configuration of the semiconductor optical device of the first embodiment.

FIG. 5 is a top view of the stem of the semiconductor optical device of the first embodiment.

FIG. 6 is a cross-sectional side view of the semiconductor optical device of the first embodiment taken along line A-A' of FIG. 1.

DETAILED DESCRIPTION OF THE PREFERRED EMBODIMENTS

First Embodiment

Configuration of Device of First Embodiment

Figure 1:
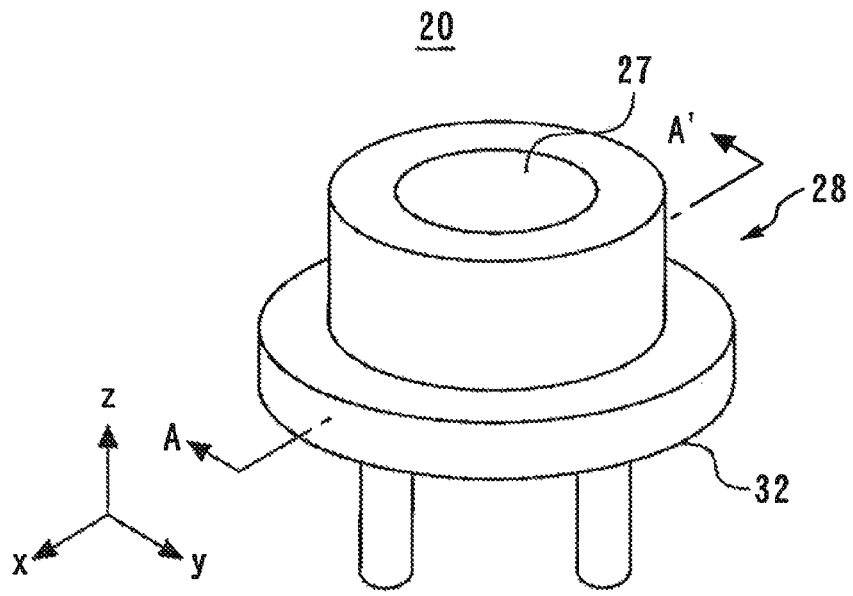
FIG. 1 is a perspective view of a semiconductor optical device in accordance with a first embodiment of the present invention.

FIG. 1 is a perspective view of a semiconductor optical device 20 in accordance with a first embodiment of the present invention. In this embodiment, the semiconductor optical device 20 has a CAN package structure. Referring to FIG. 1, the semiconductor optical device 20 includes a stem 32 and a cap (or lid) 28 which is mounted on and covers the stem 32. The stem 32 and the cap 28 are bonded together by an adhesive. The space enclosed by the cap 28 and the stem 32 is sealed, and filled with a filler gas such as air, dry gas, or nitrogen gas.

(Configuration of Cap)

Figure 2:
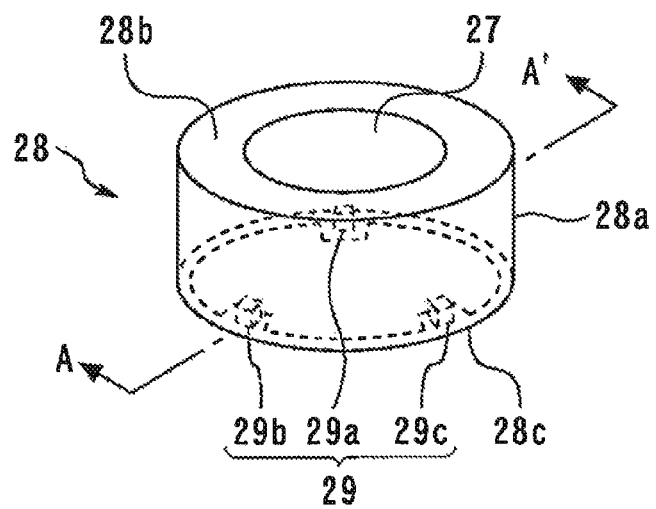
FIG. 2 is a perspective view of the cap of the semiconductor optical device of the first embodiment.

FIG. 2 is a perspective view of the cap 28 of the semiconductor optical device 20 of the first embodiment. The cap 28 is made of a resin. The cap 28 has a cylindrical body portion 28a. The cylindrical body portion 28a has an outside surface and an inside surface 28d which extend along the entire length of the cylindrical body portion 28a. The cap 28 has a plate portion 28b at one end of the cylindrical body portion 28a and an edge portion 28c at the other end of the cylindrical body portion 28a. The edge portion 28c is bonded to the stem 32 by an adhesive 140 so that the cap 28 covers a semiconductor optical element 100. It should be noted that the adhesive 140 is applied to the entire circumference of the edge portion 28c.

A lens 27 is secured to the plate portion 28b in such a manner that the lens 27 is integrated with the cap 28. Specifically, the lens 27 is attached integrally to the cap 28 by molding.

The cap 28 has three recesses 29, which may be hereinafter referred to as the recesses 29a, 29b, and 29c, respectively, for convenience.

FIGS. 3A and 3B show bottom views of the cap 28 of the semiconductor optical device 20 of the first embodiment. FIGS. 3A and 3B are substantially the same, except that the parts numbered in FIG. 3A are not numbered in FIG. 3B, and vice versa. As shown in FIG. 3B, the cylindrical body portion 28a has three first portions P1 and three second portions P2. The second portions P2 are spaced apart from each other in the circumferential direction of the cylindrical body portion 28a and project inwardly relative to the first portions P1. The first portions P1 have an inner curvature radius r1, and the second portions P2 have an inner curvature radius r2 which is smaller than the inner curvature radius r1. The first portions P1 of the cap 28 have a relatively small thickness, and the second portions P2 have a relatively large thickness. It should be noted that the first portions P1 and the second portions P2 of the subsequently described variations of the first embodiment and the subsequently described second and third embodiments have the same configurations as the first portions P1 and the second portions P2 of the first embodiment.

(Configuration of Stem)

FIG. 4 is a perspective view showing the internal configuration of the semiconductor optical device 20 of the first embodiment. Referring to FIG. 4, lead pins 36 configured as bar terminals are bonded to the stem 32. Although in this example the semiconductor optical device 20 has four lead pins 36, it is to be understood that it may have five or more lead pins 36.

The stem 32 is made of a metal and may be, e.g., a circular ion plate having a diameter of approximately 3-10 mm. The stem 32 has four through-holes 40 therein, each receiving a respective one of the four lead pins 36 therethrough. The lead pins 36 are bonded to the stem 32 by glass hermetic material 44. This hermetic material also seals the gaps between the through-holes 40 and the lead pins 36. A metal block 14 is bonded by solder to the top surface 32a of the stem 32, which surface serves as the main surface of the stem 32. Further, a submount 13 is bonded onto the metal block 14 by solder, and the semiconductor optical element 100 is bonded to the submount 13 by solder. In this example, the semiconductor optical element 100 is a semiconductor laser element. It should be noted, however, that the semiconductor optical device 20 may be configured as a photodetector device having a photodiode as its semiconductor optical element.

The semiconductor optical element 100 is connected to each lead pin 36 on the top surface 32a side of the stem 32 by a gold wire 15 serving as a signal line.

The cap 28 covers components on the top surface 32a side of the stem 32, such as the upper projecting portions of the lead pins 36, the gold wires 15, the metal block 14, the submount 13, and the semiconductor optical element 100. The cap 28 is bonded to the top surface of the stem 32 by the adhesive 140 so that the space within the cap 28 is hermetically sealed. The lens 27 is integrally attached to and forms a part of the top of the cap 28, and laser light exits the semiconductor optical device through this lens 27.

In accordance with the first embodiment, the mount to which the semiconductor optical element 100 is mounted has a multilayer structure including the submount 13 and the metal block 14. That is, the submount 13 and the metal block 14 form a mount of thermally conductive material. This mount is used for dissipating heat from the semiconductor optical element 100. That is, the mount has a heat dissipation function. The semiconductor optical element 100 is mounted on the submount 13, with its junctions facing downward. The submount 13 serves to reduce the thermal stress between the semiconductor optical element 100 and the metal block 14 and dissipate heat from the semiconductor optical element 100. The material of the submount 13 is aluminum nitride (AlN). The material of the metal block 14 is copper (Cu). The solder used to bond the submount 13 to the metal block 14 is low melting solder of AuSn. The submount 13 may be formed of silicon carbide (SiC).

FIG. 5 is a top view of the stem 32 of the semiconductor optical device 20 of the first embodiment. In FIG. 5, the dashed lines indicate where the cap 28 is mounted on the top surface of the stem 32. The stem 32 has three projections 33. As can be seen by comparison between FIGS. 3A, 3B, and 5, each projection 33 vertically underlies a respective one of the second portions P2 of the cap 28. Thus, in the semiconductor optical device 20 of the first embodiment, the stem 32 has the projections 33, which are disposed in such a manner that each projection 33 vertically underlies and engages or contacts a respective one of the second portions P2 of the cap 28.

Further, as can be seen by comparison between FIGS. 3 and 5, the recesses 29 of the cap 28 have a greater cross-sectional area than the projections 33 of the stem 32 and disposed such that each projection 33 fits into a respective one of the recesses 29. Further, the depth D of the recesses 29 is less than the height H of the projections 33, as described later in detail.

Each of the three projection 33 of the stem 32 vertically underlies a respective one of the three second portions P2 of the cap 28 and extends around a portion of the circumference of the stem 32. That is, these three projections 33 are located at the vertices of an acute triangle on the top surface of the stem 32, and each second portion P2 of the cap 28 vertically overlies a respective one of the projections 33 of the stem 32. As a result, the cap 28 is stably supported by the three projections 33, which are located at different points on the stem 32.

The adhesive 140 is applied to the entire circumference of the edge portion 28c of the cap 28 so that the entire edge portion 28c is bonded to the top surface 32a of the stem 32 by the adhesive 140. That is, the first portions P1 and the second portions P2, which form the edge portion 28c, are bonded to the top surface 32a of the stem 32 by the adhesive 140 so that the recesses 29 of the cap 28 are bonded to the projections 33 of the stem 32.

In the present embodiment, the second portions P2 of the cap 28, which are brought into contact with the stem projections 33 for positioning the cap 28 at a predetermined vertical position, are configured to extend around different portions of the circumference of the cylindrical body portion 28a of the cap 28. It should be noted that the vertical or height direction corresponds to the Z direction as illustrated in FIG. 1 and coincides with the direction of the optical axis of the semiconductor optical element 100. It should be noted that although the second portions P2 of the cap 28 have a relatively large thickness and hence a relatively small inner curvature radius r2, they extend around only a portion of the circumference of the cylindrical body portion 28a, as described above. This means that the first portions P1 of the cap 28, which are not brought into contact with the projections 33 of the stem 32 and hence have a relatively small thickness and a relatively large inner curvature radius r1, extend around the rest of the circumference of the cylindrical body portion 28a. Therefore, the space enclosed and defined by the cap 28 and the top surface 32a of the stem 32 is larger than would be the case if the second portions P2 of the cap 28 together extended around the entire circumference of the cylindrical body portion 28a. In this way the cap 28 can be accurately positioned at a predetermined vertical position while maximizing the interior space of the cap 28.

Figure 25:
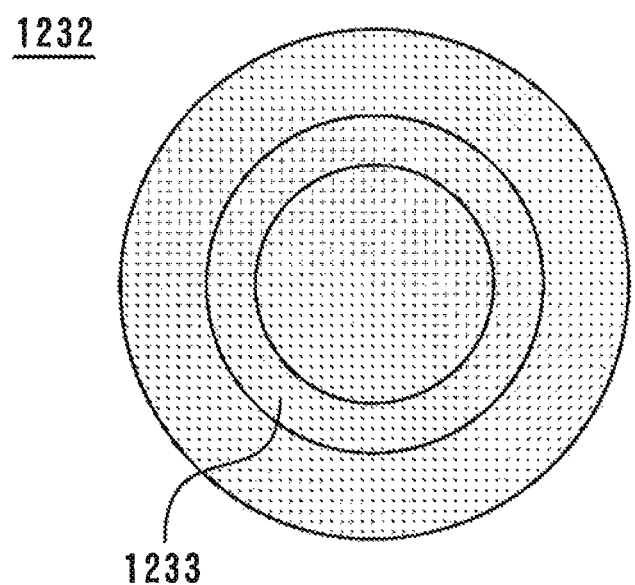
FIG. 25 is a diagram showing the top surface of a stem, presented as a comparative example for the present embodiment.

FIG. 25 is a diagram showing the top surface of a stem 1232, presented as a comparative example for the present embodiment. The stem 1232 has a cylindrical projection 1233. This projection 1233 has the same function as the projections 33 of the stem 32 of the first embodiment and is bonded to the edge portion 28c of the cap 28. In the example shown in FIG. 25, the space enclosed by the cap 28, the top surface of the stem 1232, and the inner surface of the projection 1233 (which space is available for mounting electronic components) is smaller than the space enclosed by the cap 28 and the top surface of the stem 32 of the first embodiment shown in FIG. 5, since in the first embodiment the projections 33 of the stem 32 extend around only a portion of the circumference of the stem 32 and furthermore the second portions P2 of the cap 28 extend around only a portion of the circumference of the cylindrical body portion 28a of the cap 28. Thus, the configurations of the cap 28 and the stem 32 of the first embodiment results in increased space between them, as compared to the example of FIG. 25.

The cap 28 can be accurately positioned relative to the stem 32 simply by grinding or shortening the tip of each projection 33. Specifically, if the distance between the lens 27 and the semiconductor optical device 100 is greater than the desired distance, then the tips of the three projections 33 may be equally shortened to move the cap 28 toward the stem 32. It should be noted that technical difficulties in manufacture prevent the top surface 32a of the stem 32 from being a completely flat surface; therefore the top surface 32a is bound to have spatial variations in height within a certain tolerance, resulting in inclination of the cap 28. In order to prevent such inclination of the cap 28, the projections 33 may be adjusted to different heights by grinding their tips, so as to compensate for the height variations of the top surface 32a. It should be noted that it is easy to grind down the projections 33 since they extend around only a portion of the circumference of the stem 32.

Further, the recesses 29 of the cap 28 are rectangular in cross-section; that is, these recesses 29 have four sides. Therefore, it is possible to prevent misalignment between the cap 28 and the stem 32 in directions parallel to the top surface 32a of the stem 32 (i.e., X-Y plane in FIG. 1) by fitting the recesses 29 of the cap 28 onto the projections 33 of the stem 32. In this way, the cap 28 can also be accurately positioned at the desired X-Y position.

(Configuration of Vertical Cross-Section)

FIG. 6 is a cross-sectional side view of the semiconductor optical device 20 of the first embodiment taken along line A-A' of FIG. 1. As shown in FIG. 6, the cap is secured to the stem so that the center C of the lens is on the optical axis AX of the semiconductor optical element 100. Thus, the cap is accurately positioned and oriented relative to the stem 32 (or the semiconductor optical element 100). This may be accomplished by grinding or shortening the tips of the projections 33 of the stem 32 so that the projections 33 have suitable different heights.

Figure 7:
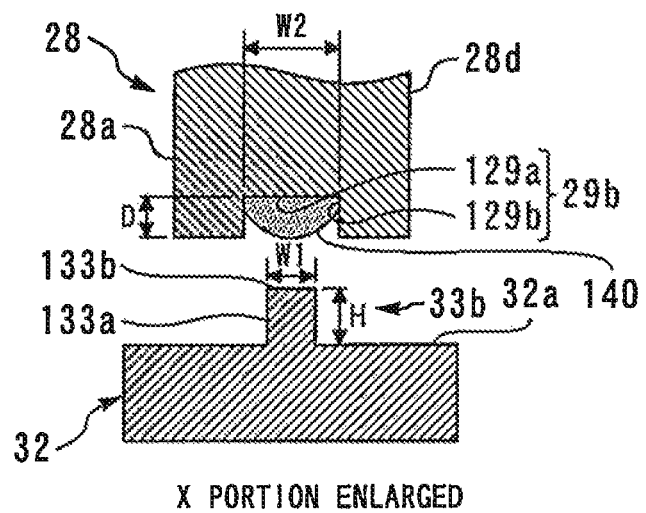
FIG. 7 is an enlarged cross-sectional view of the portion shown in dashed line X of FIG. 6.

FIG. 7 is an enlarged cross-sectional view of the portion shown in dashed line X of FIG. 6. FIG. 7 illustrates only the projection 33b for convenience; however, the other projections 33 (i.e., the projections 33a and 33c) have the same configuration as the projection 33b. As shown in FIG. 7, the projection 33b has a height H. Further, the recess 29b has a depth D. The depth D is less than the height H. Further, the projection 33b has an upper edge 133b and side surfaces 133a. Further, the recess 29b has a bottom surface 129a and side surfaces 129b. The width W2 of the bottom surface 129a of the recess 29b is greater than the width W1 of the upper edge 133b of the projection 33b.

FIG. 7 shows a cross-sectional view of the recess 29b and the projection 33b taken along only one plane. It should be noted, however, that the cross-sectional view of the recess 29b and the projection 33b taken along a plane perpendicular to that plane (i.e., perpendicular to the plane of the paper in FIG. 7) is identical to the cross-sectional view of FIG. 7. That is, the recesses 29 have lateral dimensions slightly greater than those of projections 33 so that each projection 33 fits into a respective one of the recesses 29. In the present embodiment, the difference between the width W2 of the bottom surface 129a of the recess 29b and the width W1 of the upper edge 133b of the projection 33b is relatively large so that the adhesive 140 can be applied in a substantial amount between the recess 29b and the projection 33b. However, the difference between the width W2 and the width W1 may be just large enough that the projection 33b will fit into the recess 29b even if these widths vary within a tolerance range.

The adhesive 140 is applied between the recess 29b and the projection 33b so that the upper edge 133b (facing in the Z direction) and the side surfaces 133a (perpendicular to X-Y plane) of the projection 33b are bonded to the recess 29b, making it possible to firmly secure the cap 28 to the stem 32 and thereby achieve enhanced transverse load resistance.

Figure 8:
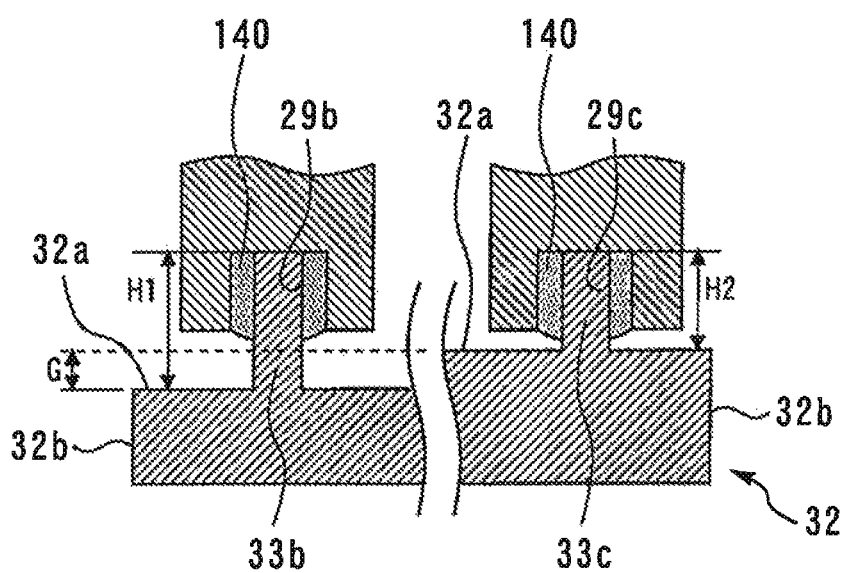
FIG. 8 is a diagram showing the way in which the cap is positioned at a predetermined vertical position by the projections of the stem, demonstrating advantages of the semiconductor optical device of the first embodiment.

FIG. 8 is a diagram showing the way in which the cap 28 is positioned at a predetermined vertical position by the projections 33 of the stem 32, demonstrating advantages of the semiconductor optical device 20 of the first embodiment. Specifically, in this example, the projections 33b and 33c have different heights H1 and H2. The reason for this is that there is a difference G in height between the portions of the stem top surface 32a underlying the recess 29b and underlying the recess 29c, as shown in FIG. 8. The height H1 of the projection 33b is greater than the height H2 of the projection 33c to compensate for this height difference G. It should be noted that the recesses 29b and 29c have the same depth D.

As described above, the depth D of the recesses 29 is less than the height H of the projections 33. Therefore, each recess 29 is held by a respective one of the projections 33 (serving as a stopper), so that the recess 29 is vertically spaced apart from the top surface 32a of the stem 32 by an amount equal to the difference between the depth of the recess 29 and the height of the projection 33. This means that since the height H1 of the projection 33b is greater than the height H2 of the projection 33c, the recess 29b is held higher than the recess 29c relative to the top surface 32a of the stem 32, thereby compensating for the height difference G described above. Thus, the vertical position and orientation of the cap 28 can be adjusted by grinding and thence shortening the projections 33. In this way, the lens 27 can be accurately positioned relative to the semiconductor optical element 100, as shown in FIG. 6.

Variations of Device of First Embodiment

FIGS. 9A to 13B are diagrams showing variations of the semiconductor optical device 20 of the first embodiment wherein the cap 28 and/or the stem 32 are replaced by a different cap and/or stem.

Figure 9A:
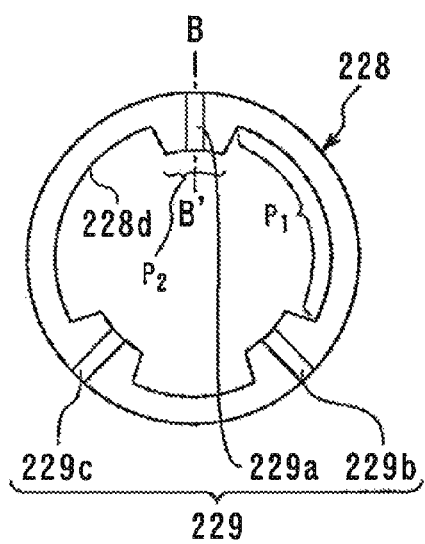
FIGS. 9A and 9B are diagrams showing variations of the semiconductor optical device of the first embodiment wherein the cap and/or the stem are replaced by a different cap and/or stem.
Figure 9B:
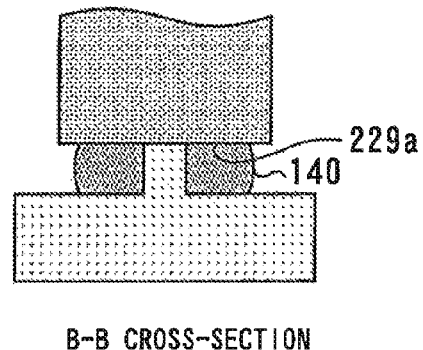

The variation shown in FIGS. 9A and 9B includes a cap 228 instead of the cap 28. The cap 228 is similar to the cap 28, except that the second portions P2 have a different configuration. Specifically, the recesses 229 of the second portions P2 of the cap 228 have a different shape than the recesses 29 of the second portions P2 of the cap 28. FIG. 9A is a bottom view of the cap 228, and FIG. 9B is a cross-sectional view of the stem 32 and the cap 228 mounted thereon, taken along line B-B' of FIG. 9A.

As shown in FIG. 9A, in this variation, the recess 229 of each second portion P2 is a groove extending from the inner surface to the outer surface of the edge portion of the cap 228. That is, each recess 229 is a groove extending from the inside surface 228d to the outside surface of the cap 228. As shown in FIG. 9B, each projection 33 of the stem 32 fits into a respective one of the recesses (or grooves) 229 and is bonded to that recess by an adhesive 140. It should be noted that the first portions P1 of the cap 228 (or the edge portion of the cap 228) are also bonded to the top surface 32a of the stem 32 by the adhesive 140 during the bonding of the projections 33 to the recesses 229.

Figure 10A:
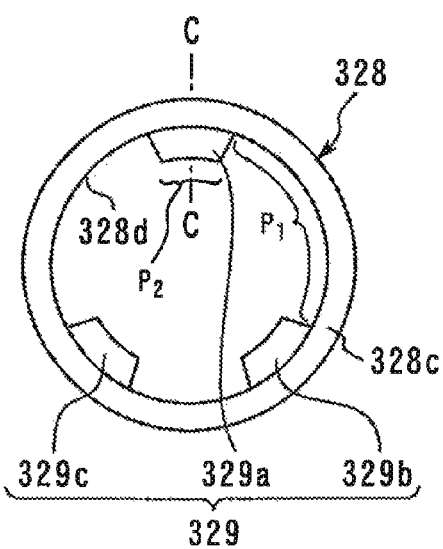
FIGS. 10A and 10B are diagrams showing variations of the semiconductor optical device of the first embodiment wherein the cap and/or the stem are replaced by a different cap and/or stem.
Figure 10B:
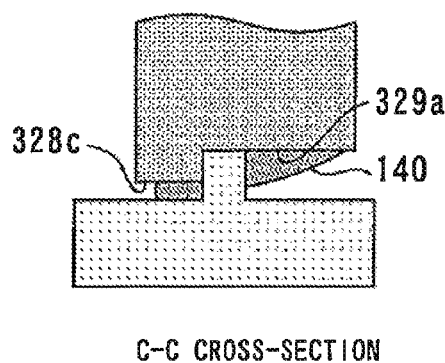

The variation shown in FIGS. 10A and 10B includes a cap 328 instead of the cap 28. The cap 328 is similar to the cap 28, except that the second portions P2 have a different configuration. Specifically, each second portion P2 of the cap 328 has a step portion 329.

FIG. 10A is a bottom view of the cap 328, and FIG. 10B is a cross-sectional view of the stem 32 and the cap 328 mounted thereon, taken along line C-C' of FIG. 10A. In this variation, each step portion 329 (of the second portions P2) extends from the inner surface of the edge portion 328c of the cap 328. That is, each step portion 329 projects inwardly from the inside surface 328d of the cap 328.

As can be seen from the cross-section of FIG. 10B, the edge portion 328c projects downward relative to the plane of the bottom surface of each step portion 329. That is, the bottom surface of the edge portion 328c is lower than that of the step portions 329. The upper edge of each projection 33 of the stem 32 is brought into contact with the bottom surface of a respective one of the step portions 329. Thus, each projection 33 fits into a respective one of the step portion 329 and is bonded to that step portion by an adhesive 140. It should be noted that the first portions P1 of the cap 328 (or the edge portion of the cap 328) are also bonded to the top surface 32a of the stem 32 by the adhesive 140 during the bonding of the projections 33 to the step portions 329.

Figure 11A:
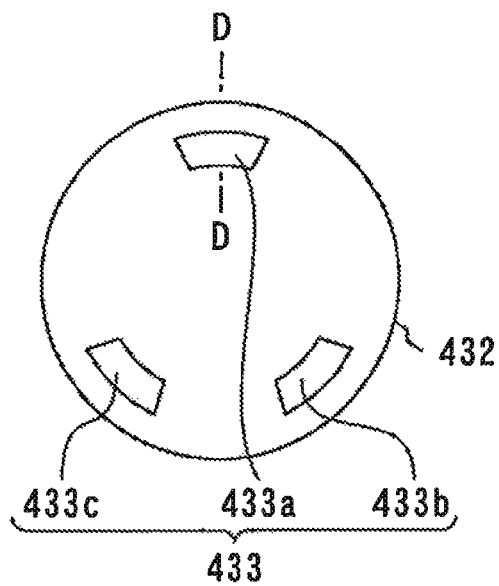
FIGS. 11A and 11B are diagrams showing variations of the semiconductor optical device of the first embodiment wherein the cap and/or the stem are replaced by a different cap and/or stem.
Figure 11B:
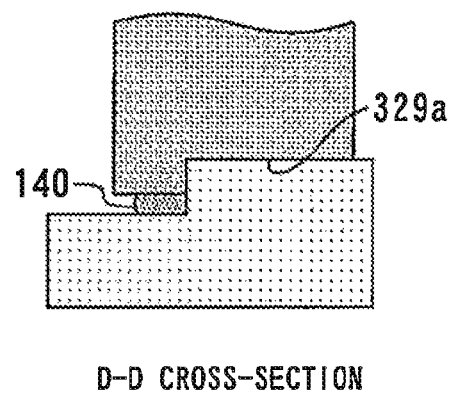

The variation shown in FIGS. 11A and 11B includes the cap 328 (described above in connection with the variation shown in FIGS. 10A and 1-B) and a stem 432 (described below) instead of the cap 28 and the stem 32 of the first embodiment. The stem 432 is similar to the stem 32, except that the projections 33 are replaced by projections 433 having a different configuration. FIG. 11A is a top view of the stem 432, and FIG. 11B is a cross-sectional view of the stem 432 and the cap 328 mounted thereon, taken along line D-D' of FIG. 11A. The projections 433 of the stem 432 of this variation have a dimension in the radial direction of the stem 432 greater than the dimension of the projections 33 of the stem 32 of the first embodiment in the radial direction of the stem 32. As a result, the upper edge of each projection 433 can be brought into contact with the entire bottom surface of a respective one of the step portions 329 of the cap 328. This variation has the same advantages as described above in connection with the first embodiment. Further, the three projections 33 of the stem 32 of the first embodiment may be replaced by a single large circular projection. In this case, the cross-section of each second portion 12 and the adjacent portion of the stem 32 taken along a line corresponding to line D-D' of FIG. 11A is the same as that shown in FIG. 11B. However, the central portion of the stem 32 on which various components such as the metal block 14 are mounted is higher than the edge portion of the stem 32; that is, the components are mounted on the circular projection. This configuration also has the same advantages as described above in connection with the first embodiment. Thus, since the three projections 33 of the stem 32 are replaced by a single large circular projection, the stem has a simpler configuration, making it possible to reduce manufacturing costs without degrading the positioning accuracy of the cap relative to the stem.

Figure 12:
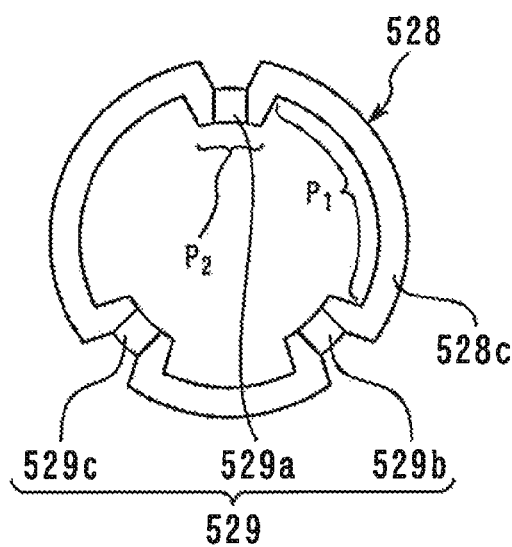
FIG. 12 is a diagram showing variations of the semiconductor optical device of the first embodiment wherein the cap and/or the stem are replaced by a different cap and/or stem.

The variation shown in FIG. 12 includes a cap 528 instead of the cap 28. The cap 528 is similar to the cap 28, except that the second portions P2 have a different configuration. FIG. 12 is a bottom view of the cap 528. Referring to FIG. 12, the second portions P2 of the cap 528 have a relatively small thickness, as compared to the second portions P2 of the cap 28 of the first embodiment. Specifically, in the case of the cylindrical body portion of the cap 528, the first portions P1 and the second portions P2 have substantially the same thickness. Instead, the three second portions P2 are displaced toward the center axis of the cylindrical body portion of the cap 528 relative to the first portions P1 and have recesses 529a, 529b, and 529c, respectively, formed therein. (It should be noted that the first portions P1 and the second portions P2 are formed on the edge portion 528c of the cylindrical body portion.) Each projection 33 of the stem 32 fits into and is in contact with a respective one of the recesses 529 (i.e., recesses 529a, 529b, and 529c) in the same manner as shown in FIG. 9B.

Figure 13A:
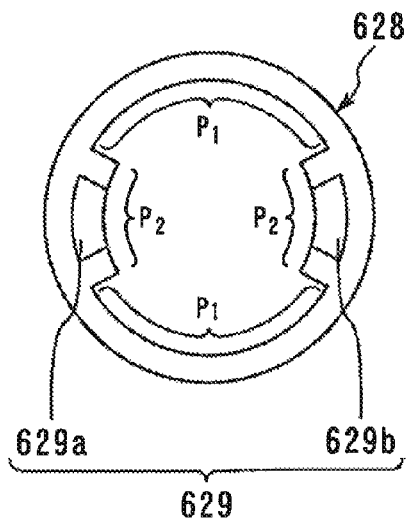
FIGS. 13A and 13B are diagrams showing variations of the semiconductor optical device of the first embodiment wherein the cap and/or the stem are replaced by a different cap and/or stem.
Figure 13B:
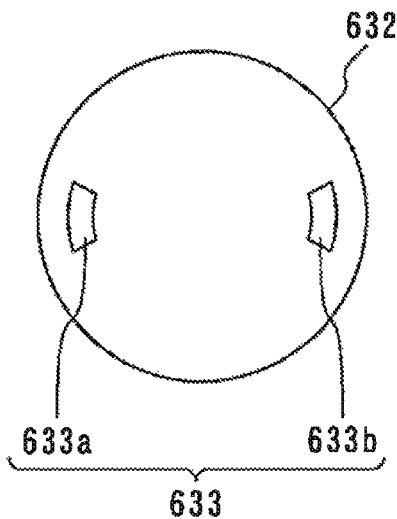

The variation shown in FIGS. 13A and 13B includes a cap 628 and a stem 632 instead of the cap 28 and the stem 32. FIG. 13A is a bottom view of the cap 628, and FIG. 13B is a top view of the stem 632. In the first embodiment and the variations thereof described above, the cylindrical body portion 28a has three second portions P2 having a recess, and the stem has three projections, each of which fits into a respective one of the recesses of the second portions P2. In the variation shown in FIGS. 13A and 13B, on the other hand, the cylindrical body portion of the cap 628 has two second portions P2 having a recess 629, and the stem 632 has two projections 633. Specifically, in the variation shown in FIGS. 13A and 13B, the two second portions P2 are disposed at diagonally opposite positions on the edge portion of the cylindrical body portion of the cap 628 and have a relatively large length along the circumference of the cylindrical body portion (and are larger in area than the second portions P2 of the first embodiment). Further, the two projections 633 of the stem 632 are also disposed at diagonally opposite positions on the top surface of the stem 632 and have a relative large length along the circumference of the stem 632 (and hence are larger in area than the projections 33 of the first embodiment). As a result, although the stem 632 has only two projections (namely, the two projections 633), the cap 628 is stably supported by and secured to these projections. Further, it is possible to maximize the interior space of the cap 628, as in the first embodiment.

Figure 14:
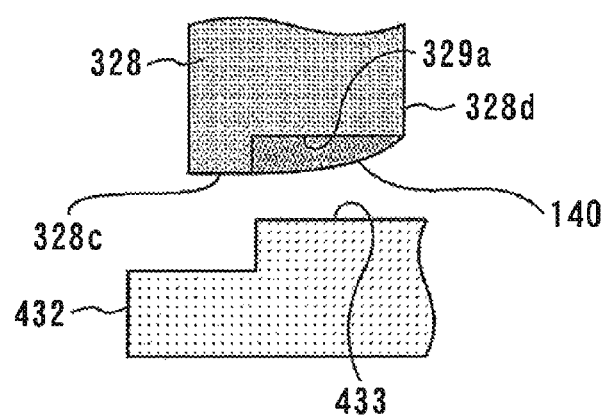
FIG. 14 shows the way in which the cap is bonded to the stem by an adhesive.
Figure 15:
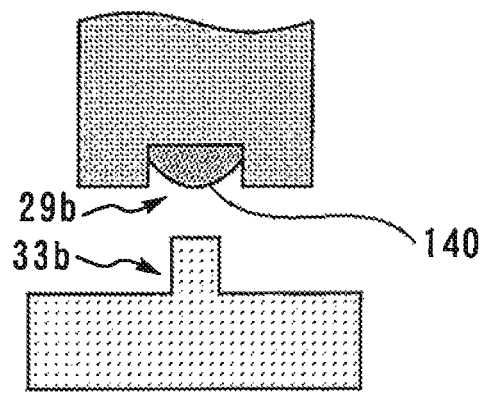
FIG. 15 shows the way in which, e.g., the recess of the cap is bonded to the projection of the stem by an adhesive.

Returning now to the variation shown in FIGS. 11A and 11B, FIG. 14 shows the way in which the cap 328 is bonded to the stem 432 by an adhesive 140. As a result of the configurations of, e.g., the step portion 329a of the cap 328 and the projection 433a of the stem 432, the adhesive 140 is trapped on the bottom surface of the step portion 329a (i.e., tapped on the left side of the cap 328 as viewed in FIG. 14), thus preventing the adhesive from flowing onto the inside surface 328d of the cap 328 (i.e., preventing the adhesive from flowing toward the right side of the cap as viewed in FIG. 14). Returning now to the semiconductor optical device 20 of the first embodiment, FIG. 15 shows the way in which, e.g., the recess 29b of the cap 28 is bonded to the projection 33b of the stem 32 by an adhesive 140. As a result of the configurations of the recesses 29 of the cap 28 and the projections 33 of the stem 32, the adhesive 140 is trapped at the central portion of each recess 29, thus preventing the adhesive 140 from flowing onto the outside of the edge portion 28c of the cap 28. Thus, in the first embodiment and the variations thereof described above, the configurations of the cap and the stem together have the effect of controlling the flow of the adhesive 140 and thereby controlling the amount and location of adhesive trapped.

Figure 16:
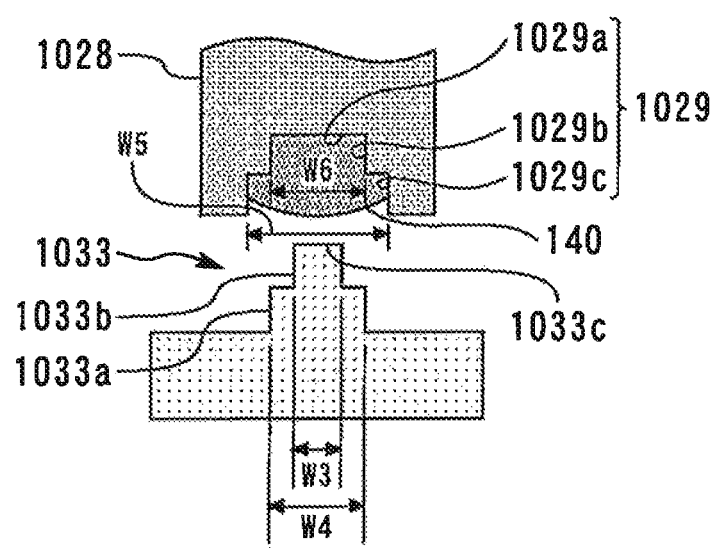
FIG. 16 is a diagram showing another variation of the semiconductor optical device of the first embodiment.

FIG. 16 is a diagram showing another variation of the semiconductor optical device 20 of the first embodiment. The variation shown in FIG. 16 includes a cap 1028 and a stem 1032 instead of the cap 28 and the stem 32. The cap 1028 is similar to the cap 28, except that the recesses 29 are replaced by recesses 1029. The stem 1032 is similar to the stem 32, except that the projections 33 are replaced by projections 1033.

Each projection 1033 of the stem 1032 has an upper edge 1033c, a first side surface 1033a having a width W4, and a second side surface having a width W3, where W3<W4, and decreases stepwise in width toward the upper edge 1033c (i.e., decreases stepwise in width with increasing distance from the top surface of the stem 1032). The recesses 1029 of the cap 1028 have a plurality of steps. Each recess 1029 has a bottom surface 1029a, a first side surface 1029b having a width W6, and a second side surface 1029c having a width W5, where W5>W6, and decreases stepwise in width toward the bottom surface 1029a. As a result of the configurations of the cap 1028 and the stem 1032 as described above, adhesive is trapped primarily on the central portion of the inner surface of each recess 1029, thus preventing adhesive from flowing onto the outside surface of the cap. Further, the configurations of the cap 1028 and the stem 1032 result in an increased adhesion area of adhesive, thus increasing adhesion between the cap 1028 and the stem 1032.

FIG. 16 shows a cross-sectional view of a recess 1029 and a projection 1033 which fits into the recess 1029, taken along only one plane. It should be noted, however, that the cross-sectional view of the recess 1029 and the projection 1033 taken along a plane perpendicular to that plane (i.e., perpendicular to the plane of the paper in FIG. 16) is identical to the cross-sectional view of FIG. 16. That is, the recesses 1029 of the cap 1028 have lateral dimensions slightly greater than those of the projections 1033 of the stem 1032 so that each projection 1033 will fit into a respective one of the recesses 1029.

Although in the first embodiment the stem 32 has projections, it is to be understood that the present invention is not limited to this particular type of stem. Each second portion P2 of the cap 28 may have a projection, and the stem 32 may have recesses in the place of and instead of the projections 33. Further, the cap may be accurately positioned by adjusting the depth D of the recesses 29 of the cap instead of or in addition to adjusting the height H of the projections 33 of the stem.

It should be noted that the projections 33 of the stem 32 may be produced by machining, or by securing separate metal block pieces to the top surface 32a of the stem 32 such as by welding.

In the first embodiment, the cylindrical body portion 28a of the cap 28 has three second portions P2 which are spaced apart from each other and extend around different portions of the circumference of the cylindrical body portion 28a. It should be noted, however, that in other embodiments the cylindrical body portion 28a may have a different number of second portions P2 (i.e., two, or four or more second portions P2) which are spaced apart from each other and extend around different portions of the circumference of the cylindrical body portion 28a. In such cases, the stem 32 may have projections 33 vertically underlying two or more of these second portions P2 of the cylindrical body portion 28a.

It should be noted that although in the first embodiment the projections 33 of the stem 32 are rectangular as viewed in plan, in other embodiments they may have a different shape. The projections 33 may be triangular, trapezoidal, pentagonal, or any other polygonal shape, as viewed in plan. Further, they may be circular or elliptical as viewed in plan. Further, the projections 33 of the stem 32 need not have a shape analogous to that of the recesses 29 of the cap 28. The present embodiment requires only that each projection 33 fit into a respective one of the recesses 29.

Second Embodiment

Figure 17:
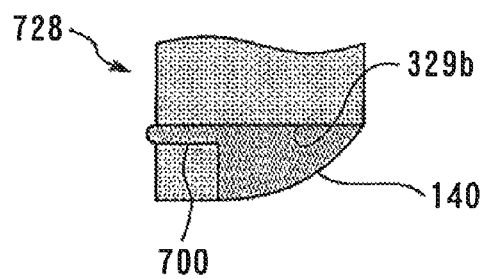
FIG. 17 is a diagram illustrating a configuration of a semiconductor optical device in accordance with a second embodiment of the present invention.

FIG. 17 is a diagram illustrating a configuration of a semiconductor optical device in accordance with a second embodiment of the present invention. The semiconductor optical device of the second embodiment is similar to the semiconductor optical device 20 of the first embodiment, except that the second portions P2 of the cap have a different configuration.

FIG. 17 shows an enlarged cross-sectional view of a portion of the cap 728 of the semiconductor optical device of the second embodiment, which portion corresponds to the portion shown in dashed line X of FIG. 6. That is, the cross-section shown in FIG. 17 corresponds to the cross-sections shown in FIGS. 7 and 9A to 11B, and also corresponds to the cross-section shown in FIG. 14. The cap 728 is similar to the cap 328 described above with reference to FIGS. 10A and 10B, and the three second portions P2 of the cap 728 have the step portions 329a, 329b, and 329c, respectively. However, the cap 728 differs from the cap 328 in that the cap 728 has a through-hole 700 for at least one of the step portions 329a, 329b, or 329c.

In the example shown in FIG. 17, when the cap 728 and the stem 432 are assembled, a first opening of the through-hole 700 for the step portion 329b faces a side surface of the projection 433b of the stem 432 of the semiconductor optical device, and a second opening of the through-hole 700 is located outside the step portion 329b, specifically, at the outside surface of the cap 728. This through-hole 700 serves as a spill port for the adhesive 140. The provision of the through-hole 700 for the step portion 329b allows the step portion 329b to be bonded to the projection 433b of the stem 432 by a substantially predetermined amount of adhesive.

Figure 18A:
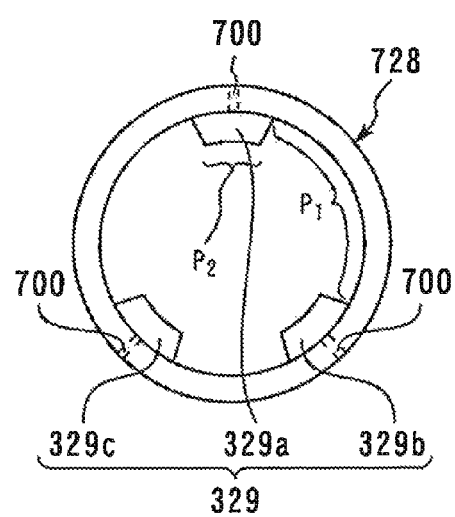
FIG. 18A is a bottom view of the cap of the semiconductor optical device of the second embodiment.
Figure 18B:
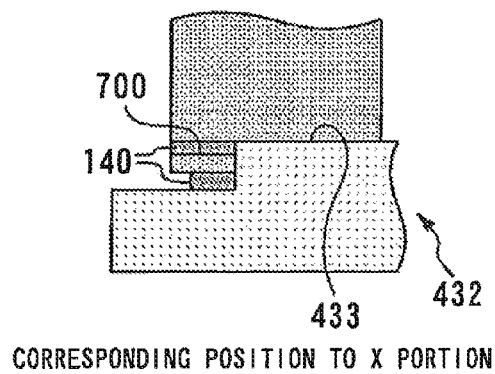
FIG. 18B is a diagram showing the way in which the cap and the stem are bonded together.

FIG. 18A is a bottom view of the cap 728 of the semiconductor optical device of the second embodiment. As shown in FIG. 18A, each of the three second portions P2 of the cap 728 may have a through-hole 700. Further, each of the second portions P2 may have a plurality of through-holes 700. FIG. 18B is a diagram showing the way in which the cap 728 and the stem 432 are bonded together.

Figure 19:
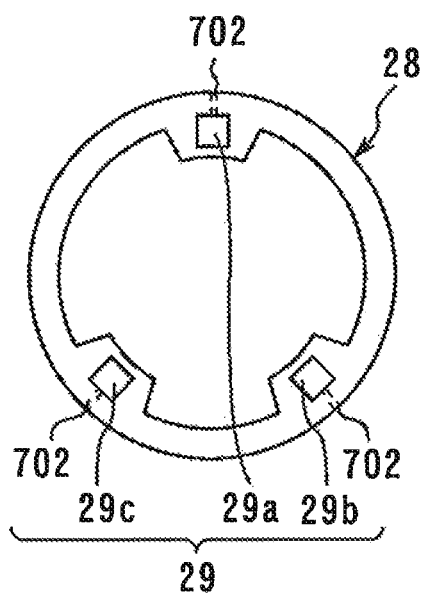
FIG. 19 is a diagram showing variations of the semiconductor optical device of the second embodiment.
Figure 20:
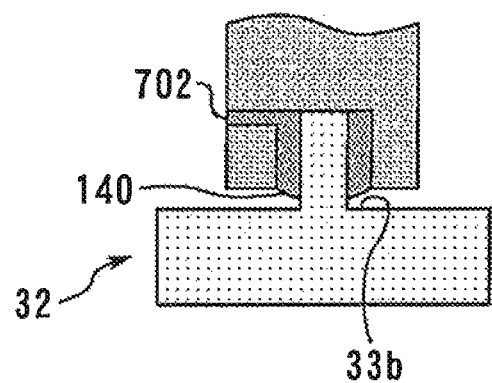
FIG. 20 is a diagram showing variations of the semiconductor optical device of the second embodiment.

FIGS. 19 and 20 are diagrams showing a variation of the semiconductor optical device of the second embodiment (or first embodiment). Specifically, FIG. 19 is a bottom view of the cap 28 of this variation (or semiconductor optical device) wherein the cap has through-holes 702. FIG. 20 is a cross-sectional view showing the way in which the cap 28 is mounted on the stem 32. This variation differs from the semiconductor optical device of the first embodiment in that each second portion P2 of the cap 28 has a through-hole 702 which is similar to the through-holes 700 of the second embodiment.

It should be noted that all three second portions P2 need not be provided with a through-hole 702; only one or two of them may have a through-hole 702.

Third Embodiment

Figure 21:
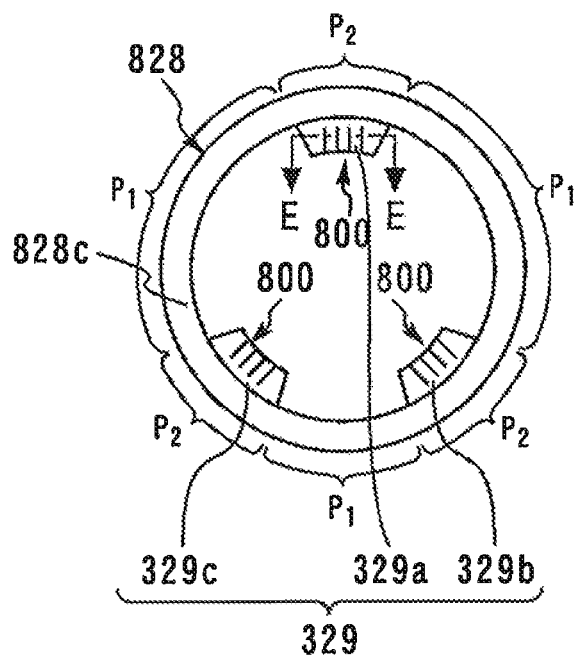
FIG. 21 is a diagram showing a configuration of a semiconductor optical device in accordance with a third embodiment of the present invention.

FIG. 21 is a diagram showing a configuration of a semiconductor optical device in accordance with a third embodiment of the present invention. Specifically, FIG. 21 shows the configuration of the cap 828 of the semiconductor optical device of the third embodiment. The cap 828 is similar in basic configuration to the cap 328 described above with reference to FIGS. 10A and 10B, and the three second portions P2 of the cap 828 have a step portion 329. However, the cap 828 differs from the cap 328 in that each step portion 329 (which constitutes a portion of the edge portion 328c of the cap 828) has a slit structure 800 formed in its surface. Except for this feature, the semiconductor optical device of the third embodiment is similar in configuration to the semiconductor optical device of the first embodiment.

Each slit structure 800 includes a plurality of parallel slits. Thus, in the third embodiment, the bottom surface of the edge portion 328c of the cap 828, which surface is bonded to the stem 32, has slit structures 800 which are spaced apart from each other in the circumferential direction of the cylindrical body portion 328a of the cap 828. It should be noted that the edge portion 328c of the cap 828 may have a plurality of concentric slits extending around the entire circumference of the cylindrical body portion 328a.

Figure 22:
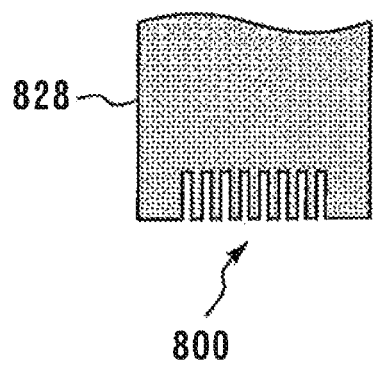
FIG. 22 is a cross-sectional view showing a configuration of the semiconductor optical device of the third embodiment.

FIG. 22 is a cross-sectional view showing a configuration of the semiconductor optical device of the third embodiment. Specifically, FIG. 22 is a cross-sectional view of one of the step portions 329 having a slit structure 800 and the adjacent portion of the edge portion 328c. As a result of this configuration, adhesive 140 is trapped in the slits of the step portion 329, resulting in an increased adhesion area.

Figure 23:
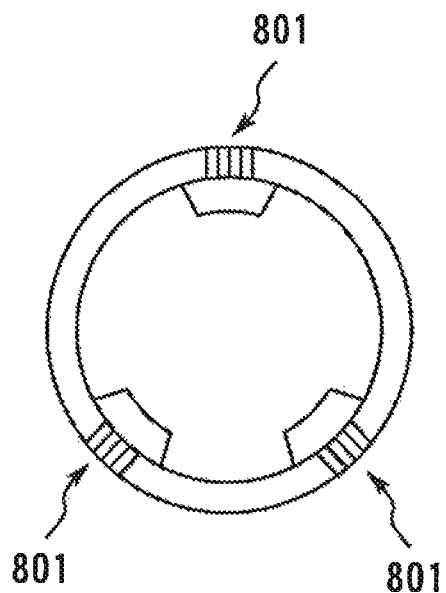
FIG. 23 is a diagram showing variations of the semiconductor optical device of the third embodiment.
Figure 24:
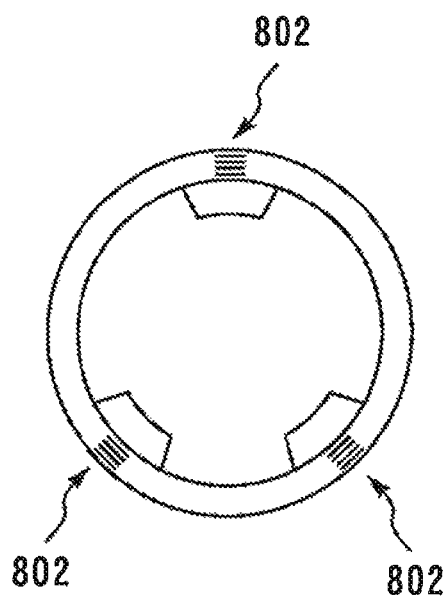
FIG. 24 is a diagram showing variations of the semiconductor optical device of the third embodiment.

FIGS. 23 and 24 are diagrams showing variations of the semiconductor optical device of the third embodiment. In the variation shown in FIG. 23, the bottom surface of the edge portion 328c of the cap 828 has slit structures 801 adjacent to, but not in, the step portions 329. Each slit structure 801 is oriented perpendicular to a respective one of the step portions 329. In the variation shown in FIG. 24, the bottom surface of the edge portion 328c of the cap 828 has three slit structures 802, each parallel to a respective one of the step portions 329. (It should be noted that the bottom surface of the edge portion 328c may be provided with slit structures that are at any angle with respect to the step portions.) The cross-sectional structure of the slit structures 801 and 802 described above may be identical to that of the slit structures 800 of the third embodiment. Further, the number and width of slits of the slit structures 801 and 802 may be equal to those of the slit structures 800.

Though not shown, the recesses 29 of the cap 28 of the first embodiment may have a slit structure formed in an inner surface thereof (i.e., in the bottom surface 129a or a side surface 129b). The features and advantages of the present invention may be summarized as follows. Thus, in the semiconductor optical device of the present invention, the cylindrical body portion of the cap has a plurality of second portions, each extending around only a portion of the circumference of the cylindrical body portion and having a first engagement feature (e.g., a recess or projection). Further, the stem of the semiconductor optical device has a plurality of second engagement features (e.g., projections or recesses), each underlying and engaging or contacting a respective one of the first engagement features of the second portions of the cap. This configuration allows the cap to be accurately positioned at a predetermined vertical position relative to the stem while maximizing the interior space of the cap.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2013-016560, filed on Jan. 31, 2013, including specification, claims, drawings, and summary, on which the Convention priority of the present application is based, is incorporated herein by reference in its entirety.

What is claimed is:

1. A semiconductor optical device comprising:
   a stem having a top surface;
   a semiconductor optical element secured to the top surface of the stem;
   a resin cap including
      a cylindrical body portion having a central axis, an inside side wall surface generally parallel and circumferential to the central axis, and an outside side wall surface generally parallel and circumferential to the central axis, wherein the inside and outside side wall surfaces extend along an entire circumference of the cylindrical body portion,
      a plate portion disposed at a first end of the cylindrical body portion, and
      an edge portion disposed at a second end of the cylindrical body portion, wherein the inside and outside side wall surfaces extend from the plate portion to the edge portion of the cylindrical body portion, and the edge portion has a lower surface bonded to the stem so that the resin cap covers the semiconductor optical element; and
   a lens attached integrally to the plate portion of the cap, wherein
      the cylindrical body portion has a plurality of first and second portions alternatingly arranged in a circumferential direction of the cylindrical body portion,
      the second portions project radially inwardly, at the inside side wall surface, toward the central axis, relative to the first portions,
      each of the second portions has a first engagement feature at the edge portion of the resin cap,
      the stem has a plurality of second engagement features at the top surface of the stem, and
      each second engagement featured underlies and engages or contacts the first engagement feature of a respective one of the second portions.

2. The semiconductor optical device according to claim 1, including at least three second portions and as many second engagement features as second portions, and wherein the second engagement features are disposed at respective different locations on the top surface of the stem and include at least three second engagement features which are located at vertices of an acute triangle on the top surface of the stem.

3. The semiconductor optical device according to claim 1, wherein
   the second engagement features are projections projecting from and transverse to the top surface of the stem and which have different heights relative to the top surface of the stem, and
   the lens is centered on an optical axis of the semiconductor optical element.

4. The semiconductor optical device according to claim 1, wherein the first engagement features are surfaces, and the second engagement features are projections projecting from and transverse to the top surface of the stem.

5. The semiconductor optical device according to claim 1, wherein
   the first engagement features are recesses,
   the second engagement features are projections projecting from and transversely to the top surface of the stem, and
   each projection is fitted into a respective one of the recesses.

6. The semiconductor optical device according to claim 5, wherein the projections are arranged along a circumference on the top surface of the stem.

7. The semiconductor optical device according to claim 5, wherein the recesses have depths less than heights of the projections relative to the top surface.

8. The semiconductor optical device according to claim 5, wherein
   the projections decrease stepwise in dimension toward ends of the projections remote from the top surface of the stem, and
   the recesses decrease stepwise in dimension toward bottoms of the recesses remote from the edge of the resin cap.

9. The semiconductor optical device according to claim 5, wherein the resin cap includes at least one through-hole which has a first opening at an inner surface of one of the recesses and a second opening outside the one of the recesses.

10. The semiconductor optical device according to claim 1, wherein
    the first engagement features are step portions,
    the second engagement features are projections, and
    each projections is fitted onto a respective one of the step portions.

11. The semiconductor optical device according to claim 10, wherein the resin cap includes at least one through-hole which has a first opening at a side of one of the step portions and a second opening outside the one of the step portions.

12. The semiconductor optical device according to claim 10, wherein a lower surface of each of the step portions of the resin cap includes at least one radial slit.

13. The semiconductor optical device according to claim 10, wherein the lower surface of the edge portion of the resin cap includes a plurality of slits adjacent each of the step portions of the cylindrical body portion.

* * * * *